United States Patent [19]

Hintze et al.

[11] 4,025,896
[45] May 24, 1977

[54] ILLUMINATED DISPLAY SYSTEM AND METHOD OF WIRING SAID SYSTEM

[75] Inventors: William Hintze; Niels Junior Hansen, both of Camp Hill, Pa.

[73] Assignee: AMP Incorporated, Harrisburg, Pa.

[22] Filed: June 11, 1975

[21] Appl. No.: 585,908

[52] U.S. Cl. .............................. 240/8.16; 240/2.1; 240/7.1 R; 240/7.1 A; 240/8.14; 340/79

[51] Int. Cl.² .......................................... B60Q 3/04

[58] Field of Search ............. 240/2.1, 7.1 R, 7.1 A, 240/8.16, 8.14; 174/72 A, 72 TR, 117 F, 117 FF; 339/17 F; 340/79, 80; 307/9, 10; 317/119, 122

[56] References Cited

UNITED STATES PATENTS

| | | | |
|---|---|---|---|
| 3,015,718 | 1/1962 | Petri | 240/8.16 |
| 3,065,335 | 11/1962 | Madansky | 240/8.16 |
| 3,074,043 | 1/1963 | Stearns et al. | 339/17 F |
| 3,077,535 | 2/1963 | Dupree | 240/8.16 |
| 3,120,350 | 2/1964 | Muenz | 240/8.16 |
| 3,174,576 | 3/1965 | Woofter et al. | 174/72 A |
| 3,319,216 | 5/1967 | McCullough | 339/17 F |
| 3,450,870 | 6/1969 | Curl | 240/8.16 |
| 3,522,652 | 8/1970 | Gordon | 339/17 F |
| 3,571,585 | 3/1971 | Schermerhorn | 240/8.16 |
| 3,676,668 | 7/1972 | Collins et al. | 240/8.16 |

*Primary Examiner*—Russell E. Adams
*Attorney, Agent, or Firm*—Russell J. Egan, Esq.

[57] ABSTRACT

An improved illuminated display system is disclosed which can be positively and accurately assembled with a plurality of low profiled illuminated indicator units to display a wide variety of input information. The illuminated indication is provided by a plurality of light emitting diodes inserted in edgewise fashion into slots in flat flexible circuitry with the remaining components attached thereto in conventional fashion. The circuit assembly is folded into containers to form the individual indicator units which are likewise, preferably, inserted into apertures in high current flat flexible circuitry to make wiping contact with the conductors thereof. The subject system obviates the prior art requirement for working in cramped spaces behind panels by providing the means to connect the indicator units of a display to associated circuitry from the front of the panel thereby producing a low profiled display panel.

18 Claims, 10 Drawing Figures

ILLUMINATED DISPLAY SYSTEM AND METHOD OF WIRING SAID SYSTEM

BACKGROUND OF THE INVENTION

1. The Field of the Invention

The present invention relates to an illuminated information display system and in particular to the use of light emitting diodes in combination with low and high current flat flexible circuitry to form the individual indicator units as well as the electrical connections therefor.

2. The Prior Art

The present invention will be described as it might be employed in the automotive industry. The subject invention could also be employed in any aircraft, marine or rail vehicle as well as any type of truck or automobile. However, it is to be understood that the invention is by no means limited to the transportation industry for providing an illuminated panel for displaying information regarding the vehicle. The invention likewise could be used in substantially any type of machinery where it was desired to have illuminated displays, at a single or multiple locations, of information derived from various remote sensor sources.

Returning to the automotive example, it has long been the practice in the automotive industry to form the cab or operator compartment of a vehicle with an integral steel dashboard welded into position in the vehicle body. In order to subsequently mount and wire the instrumentation to the dashboard, it is necessary for the installer or mechanic to assume quite awkward positions to get behind the dash to physically insert the various components into their proper locations and to visually observe whether or not he is correctly wiring the panel. These awkward and difficult maneuvers must be repeated every time a piece of equipment is replaced and/or repaired. For example, the conventional speedometer is inserted into the dashboard from the rear of the panel and secured in place by some latching means, such as bolts or screws. It is then necessary to connect wires for illuminating the speedometer and a cable so that the speedometer and odometer will function. Since the speedometer is generally immediately adjacent the top of the steering column, the available room for working is greatly limited making both the insertion and the repair of the speedometer a very complicated operation. The same holds true with the other indicators mounted on the dashboard, such as the oil pressure, water temperature, etc., whether they are gauges giving true readings or the warning light type of indicators which merely indicate when a critical level has been surpassed. Also, since most of the conventional indicator devices currently in use include some mechanical means to accomplish needle movement, they are rather thick in profile and require extra space for mounting and room during mounting.

The same difficulty is encountered with most car radios which are also inserted into the dashboard from the rear of the panel. When an air conditioner is subsequently added beneath the dashboard, it becomes very difficult to get to the radio and usually entails the removal of at least a portion of the air conditioner in order to get to the radio to make even the simplest repairs. The present system would overcome this disadvantage by having front mounting of all components of such a dashboard.

SUMMARY OF THE INVENTION

The present illuminated display system includes a plurality of indicator units mounted on a rigid backing member and interconnected by flat flexible circuitry. Each indicator unit includes at least one light emitting diode each inserted edgewise into a respective slot formed in flat flexible circuitry with the remaining components of the circuit added thereto by conventional means. Stiffener means support portions of the flat flexible circuit to prevent tearing and to support the diode display. The flat flexible circuit and stiffener member are folded and inserted into an indicator housing including means for effecting electrical connection with further electrical circuitry. The further circuitry is preferably also in the form of flat flexible cable which is laid across the face of a display panel having apertures formed therein. The individual indicator units are inserted from the front of the panel to engage with the flat flexible cable and to extend rearwardly through the apertures in the panel.

It is therefore an object of the present invention to produce an improved illuminated display system in which each individual display unit is formed of flat flexible circuitry having components, including light emitting diodes, inserted therein and folded into a low profile indicator housing, with a portion of the flexible circuitry available for connection to associated circuitry.

It is a further object of the present invention to provide a system for wiring an illuminated display device or the like entirely from the front of a display panel by placing at least one layer of high current flat flexible circuitry on the face of the panel and inserting a plurality of indicator units into aligned apertures in the circuitry and panel making electrical contact with the conductors of the circuitry.

It is a further object of the present invention to produce an illuminated display having a plurality of indicator units formed by flat flexible circuitry having electrical components mounted thereon and light emitting diodes mounted in an edgewise fashion in slots formed in flat flexible circuitry, and high current flat flexible circuitry receiving and connecting the indicator units to sensors, power, and the like.

It is a further object of the present invention to obviate the previous methods of wiring a vehicle dashboard panels and the like from the rear by providing a system which has flat flexible circuitry laid on the face of the dashboard and the individual illuminated display units inserted into the flat flexible cable from the front of the dashboard to electrically contact the conductors of flat cable.

It is a further object of the present invention to produce an illuminated display system which can be used in aircraft, marine, rail or automotive fields of transportation to provide the operator with a visual display indicating the status of the components of the vehicle.

It is a further object of the present invention to teach a method and system for creating an illuminated indicator display board which can be readily and economically produced.

The means for accomplishing the foregoing objects and other advantages of the present invention will become clear to those skilled in the art from the following detailed description taken with reference to the accompanying drawings.

DETAILED DESCRIPTION OF THE PREFERRED EMBODIMENT

As mentioned above, the present invention will be described in connection with the dashboard display of an automotive vehicle, in particular a truck dashboard. However, it is to be understood that the same principles of the present invention can likewise be applied to any mode of transportation, such as aircraft, marine and rail vehicles. The invention is not limited to simply the transportation industry and can be used for any instance when it is desired to have an illuminated display indicating the status of remote components. For example, the invention could equally as well be adapted for use with a static display board showing the status of all portions of a piece of equipment, such as a production line, indicating the status of the individual components and/or the product being produced at the various stages of production.

Turning now to the present example, the conventional tractor dashboard is a conglomeration of indicator devices, most of which are in the form of dials having needles moved thereacross by mechanical means in accordance with information received from a sensor. Such arrangements are not conductive to attracting the operators attention when an out-of-tolerance condition arises. For example, the water temperature gauge simply indicates when the temperature of the water in the radiator has reached or is exceeding a desirable level. Unless the driver happens to notice the needle moving across the water temperature indicator dial, his first warning of the over temperature condition may well be steam escaping from the radiator. In a similar fashion the first indication of a low tire pressure may be a slapping sound or loss of control of the vehicle.

It should also be noted that the conventional indicator units that are used in a dashboard display are often quite bulky, because of their mechanical operation, and thus project substantially from the rear of the panel. Also, until now, such units have all required mounting from the rear of the dashboard with the connections and mounting requiring operations at the rear of the dashboard in confined and not readily accessible or viewable locations.

Another indicator device that is frequently ignored by vehicle operators is the speedometer. A conventional speedometer is usually a rather thick and complex mechanical device having mechanical means to drive a pointer across a calibrated surface. There is little about the speedometer that would cause the operator's attention to be directed to the fact that he is exceeding the posted speed conditions.

The present invention overcomes the deficiencies of the prior art indicator devices by providing illuminated displays which will replace the conventional dials and warning lights currently used for indicators in the automotive industry. The illuminated indicator will call the operator's attention to the conditions being sensed and, in particular, will attract his attention when there is a change of condition.

Figure 1:
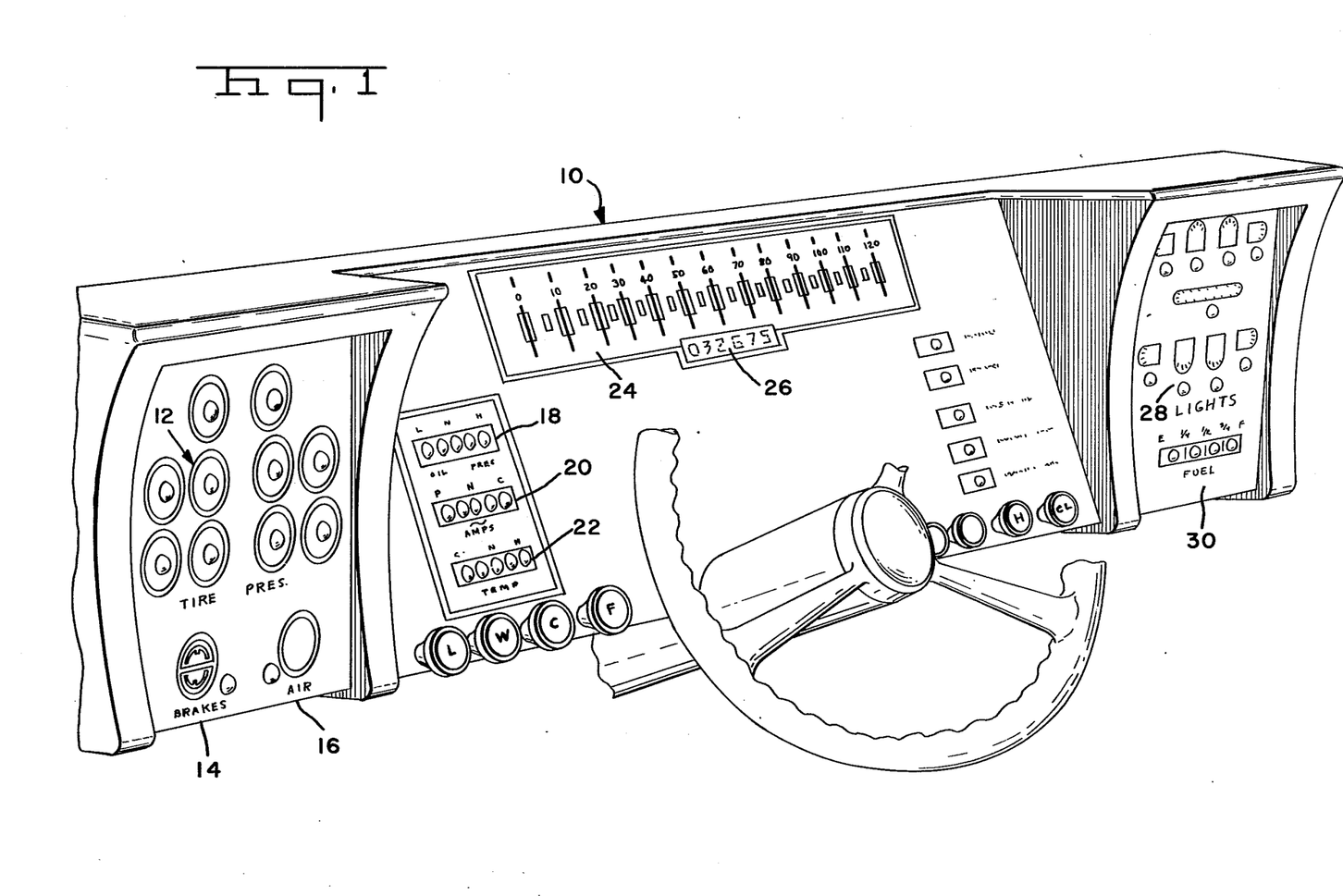
FIG. 1 is a perspective view of a truck dashboard incorporating an illuminated display system according to the present invention.
Figure 2:
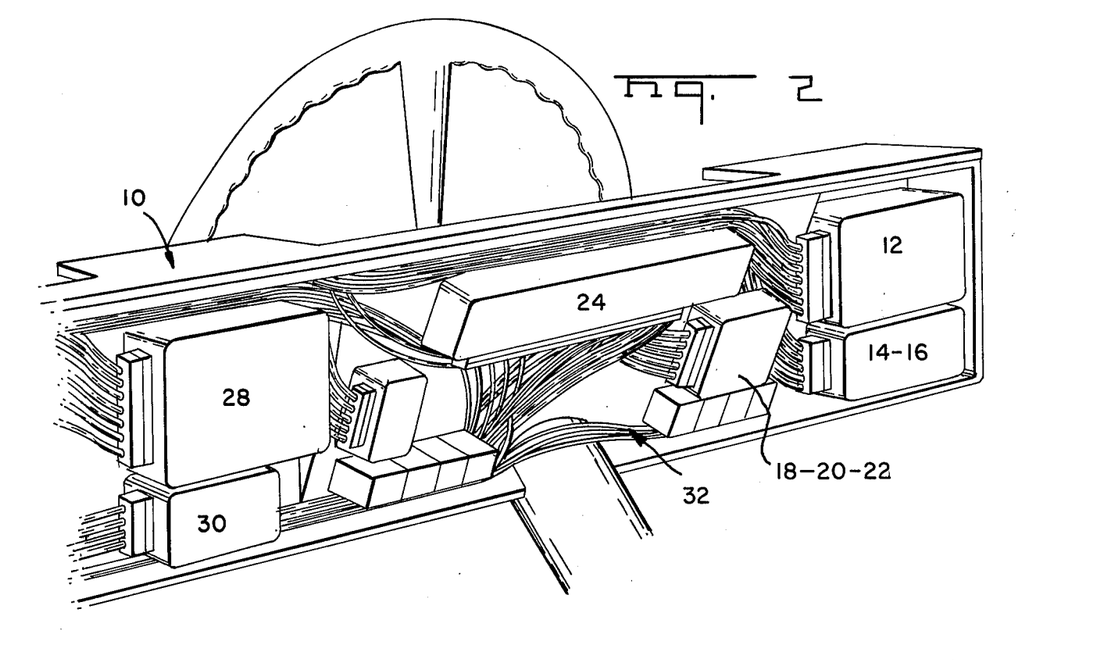
FIG. 2 is a rear view of the dashboard of FIG. 1 showing the indicator units wired from the rear by a conventional wiring harness.
Figure 3:
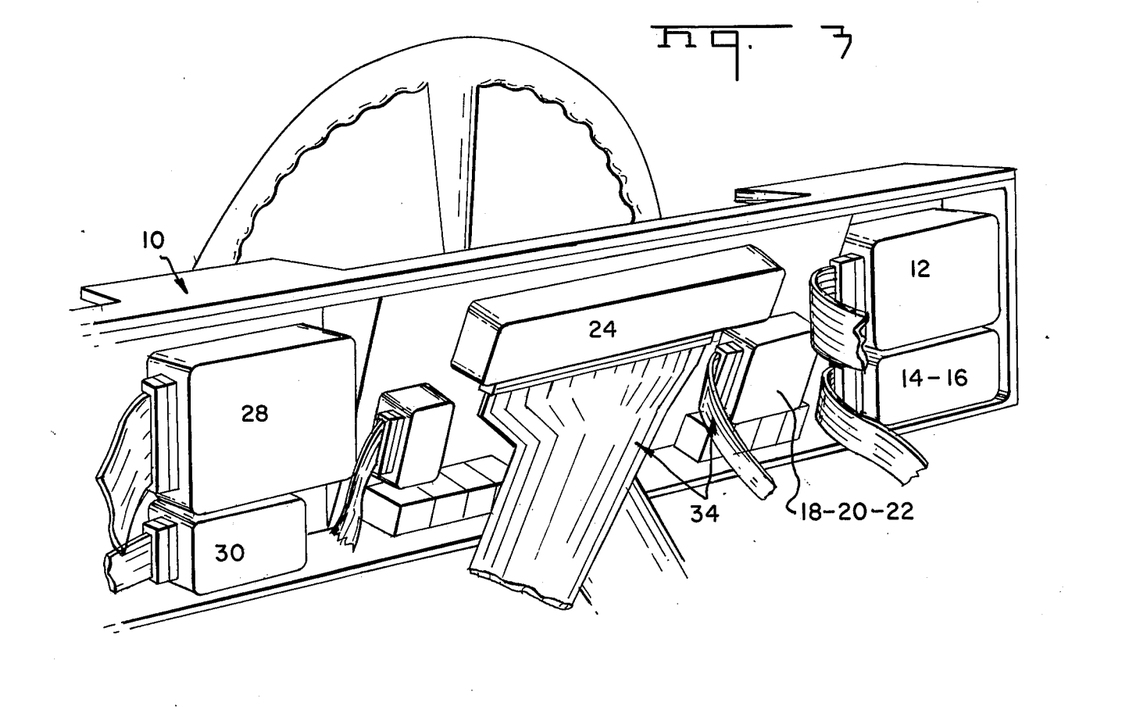
FIG. 3 is a view similar to FIG. 2 showing a first alternate method of wiring the indicator units in the dashboard from the rear with flat flexible cable.

A tractor dashboard incorporating the subject invention is shown in FIGS. 1 to 3. The dashboard 10 is shown with a number of illuminated indicator devices including tire pressure 12, brakes 14, air pressure 16, oil pressure 18, alternator or generator condition 20, radiator temperature 22, speedometer 24, odometer 26, lights 28 and fuel 30. The reverse side of this dashboard is shown in FIG. 2 as it would appear if the indicator devices were connected by a conventional wiring harness 32. FIG. 3 shows the reverse side of the dashboard as it would appear if the indicator devices were connected by flat flexible cable 34.

Figure 4:
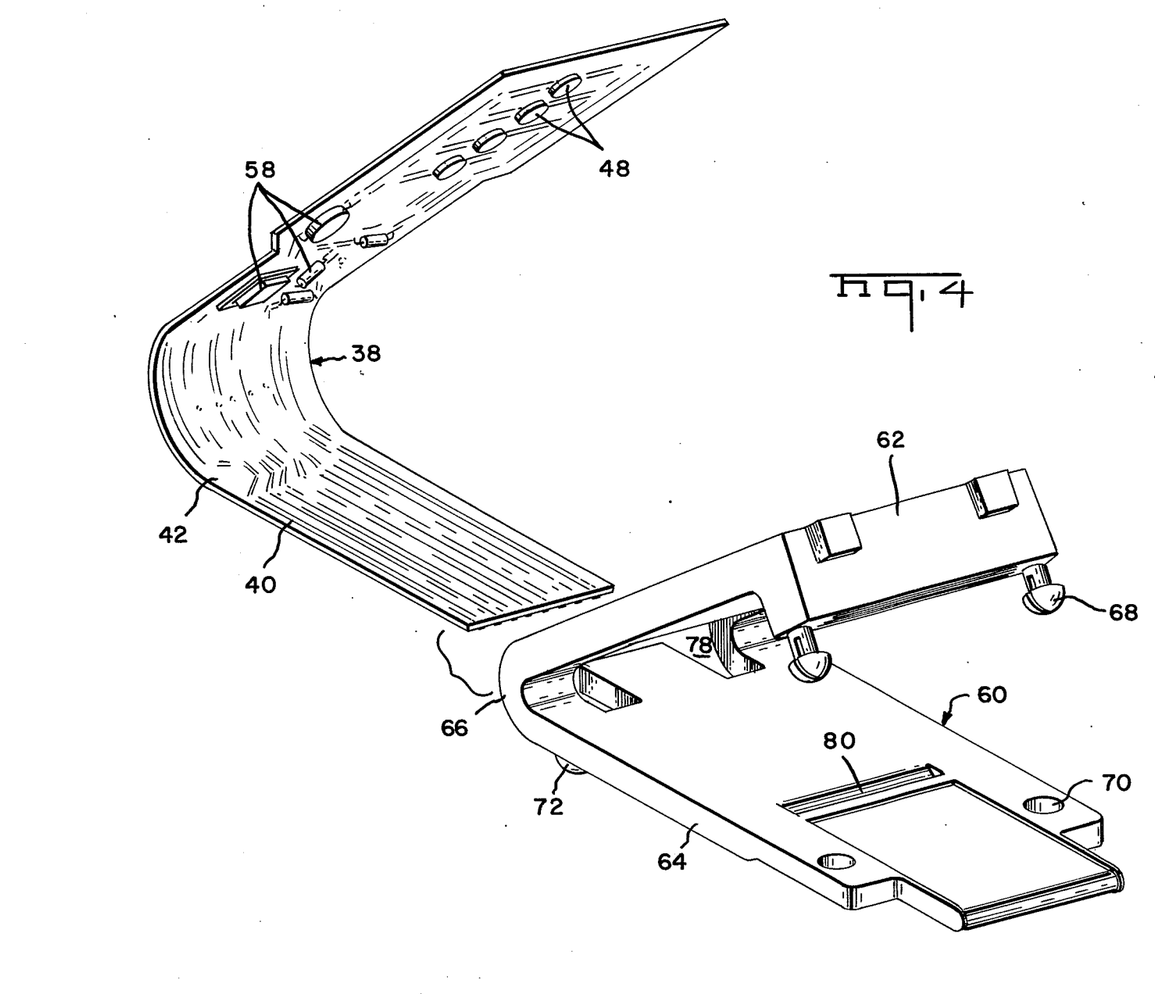
FIG. 4 is an exploded perspective view of a single, representative, illuminated indicator unit showing the flat flexible circuitry and an articulated support base.
Figures 5, 6:
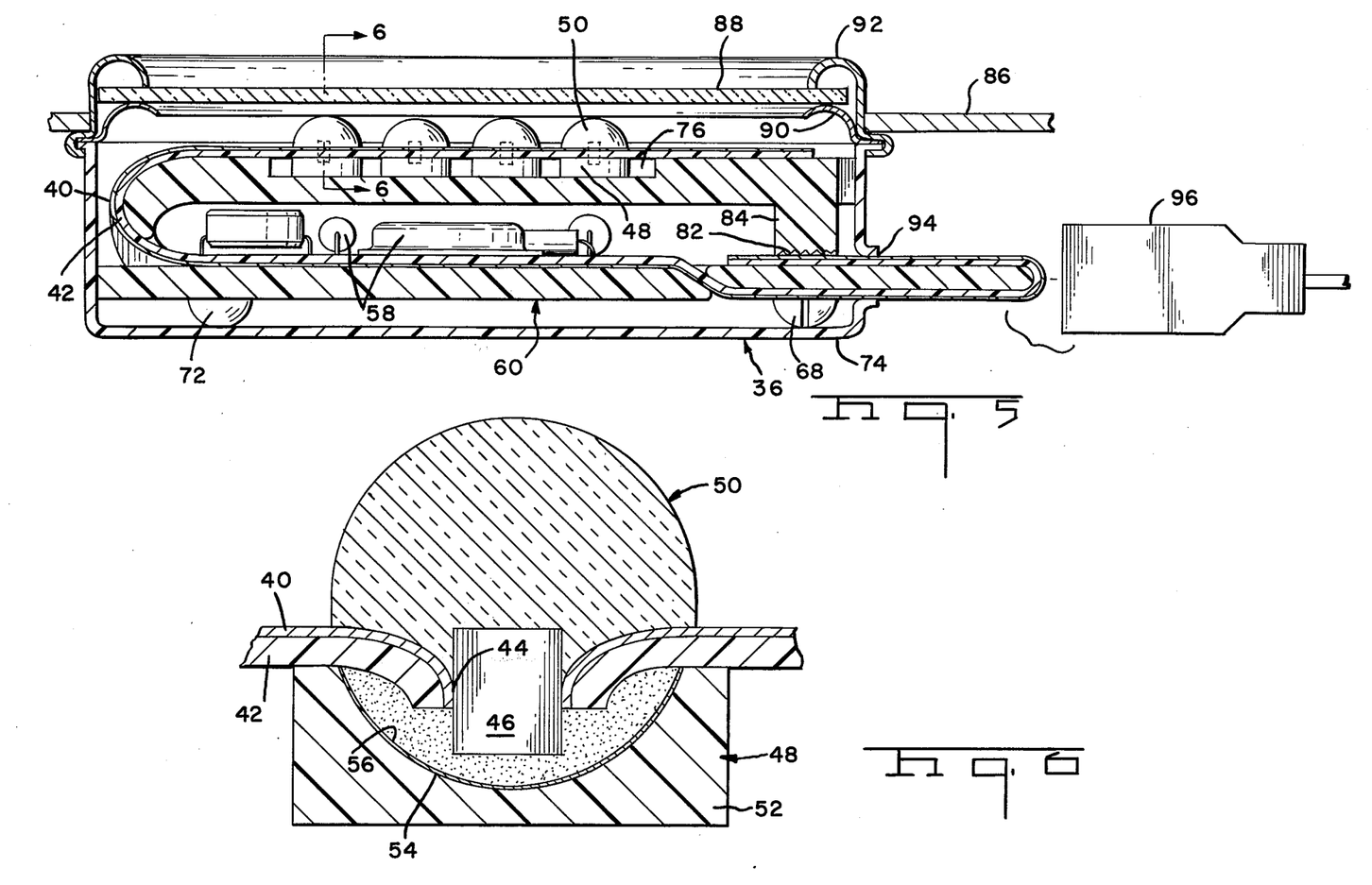
FIG. 5 is a vertical section through a representative illuminated indicator unit showing the circuitry of FIG. 4 folded in position therein.
FIG. 6 is an enlarged section taken along line 6—6 of FIG. 5 showing the mounting a single light emitting diode in the flat flexible circuitry.
Figure 7:
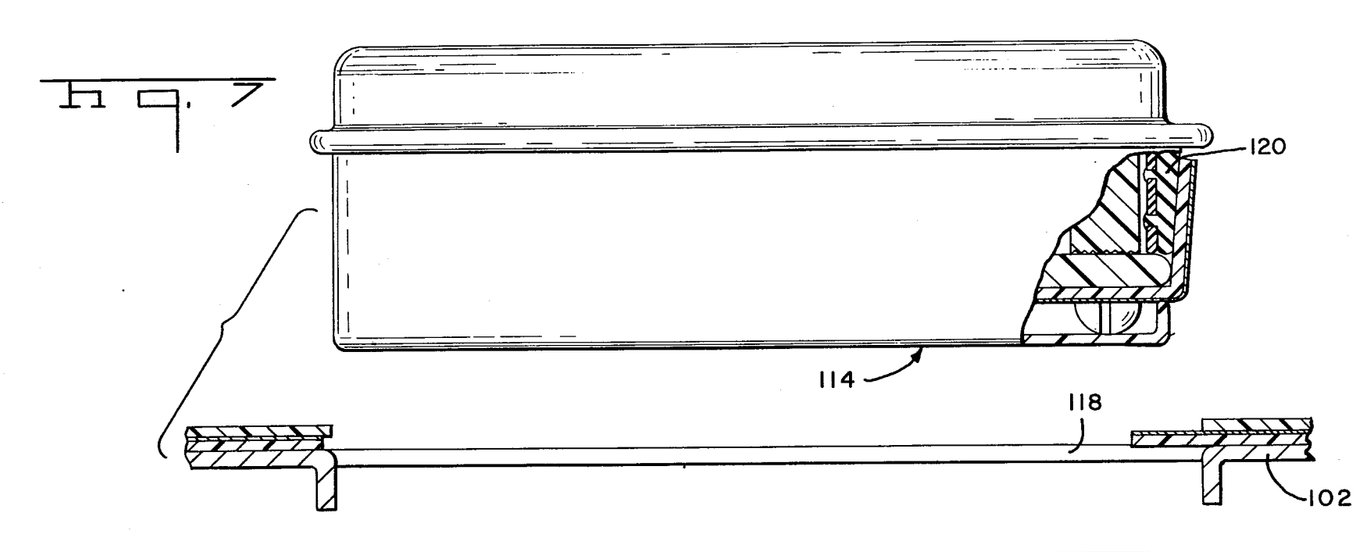
FIG. 7 is a side elevation, partially in section, showing a first alternate embodiment for connecting an indicator unit according to FIGS. 4 and 5 into an aperture in flat flexible cable.
Figure 8:
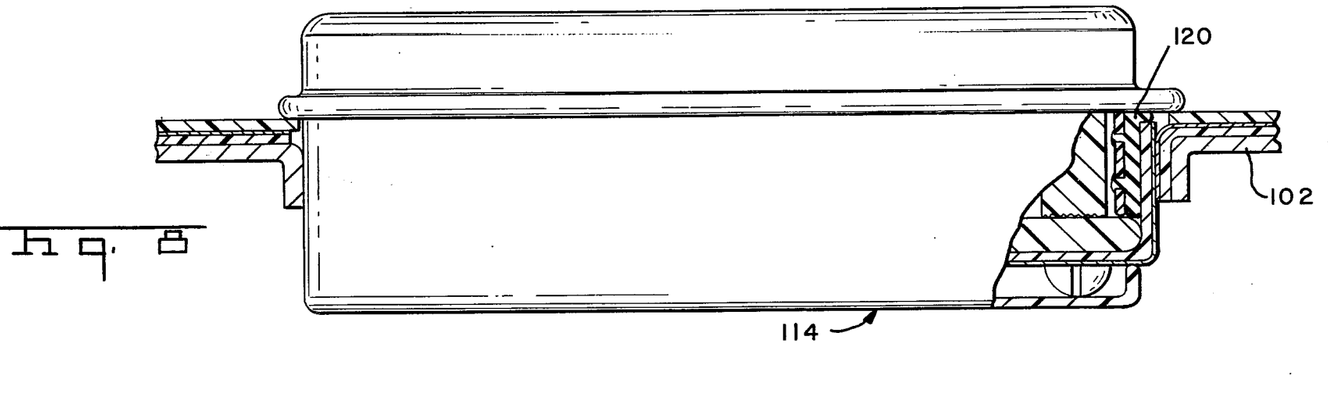
FIG. 8 is a side elevation similar to FIG. 7 showing the indicator unit fully engaged in the flat flexible circuitry.

Turning now to the individual indicator units, a typical unit 36 (see FIGS. 4 to 6) will include at least one unit of flat flexible circuitry 38 comprising a patterned metallic conductor 40 plated on or adhered to an insulator substrate 42, for example, a polyimide such as Mylar or Kapton. At least one light emitting diode receiving slot 44 is formed in one portion of the flat flexible circuitry 38 to cause an open in the conductor 40. A light emitting diode 46 is inserted into slot 44 in an edgewise configuration. The conductor 40 and substrate 42 have sufficient resiliency so that the conductor 40 on each side of the slot 44 will contact opposite sides of the diode 46. Thus the circuit is completed through the diode. The diode 46 is preferably subsequently encapsulated between a reflector 48 and a transparent lens 50. The reflector 48 can be formed of a molded plastic material 52 having a profiled cavity 54 lined by a metal layer 56 which forms reflecting surface. The lens 50 preferably incudes a light diffusion means, such as micro-sized air bubbles formed by high speed stirring of the lens material prior to molding. Both the reflector and lens are fixed to the circuitry 38 by known adhesives. A plurality of conventional electrical components 58, such as integrated circuits, resistors, and capacitors, are also attached to the circuitry 38 in a conventional manner, such as reflow soldering, to complete the circuitry necessary to perform the desired indicating function. The flexible circuitry 38 is mounted on a support member 60 in such manner as to supply support at those points where it is deemed necessary. The support member 60 is shown as an articulated member having a light emitting diode support portion 62 and a component support portion 64 hingedly attached by members 66. Latching means 68 on the free end of portion 62 are positioned to engage in apertures 70 in the free end of portion 64 to secure the support member in a closed condition with portions 62, 64 in substantially parallel spaced relationship. The ends of the latching means 68 and feet 72 serve as spacers for the support member 60 in housing 74. The support member 60 also includes a recessed portion 76 which receives and supports the reflectors 48 and at least one slot 78, 80 which allows the circuitry 38 to be positioned on the support member substantially as shown, with both the diode and component portions of the circuitry fully supported. It should be noted that portion 64 is longer than portion 62 and that the end of the circuitry 38 is folded about this extension and secured in position by roughened surface 82 of spacing block 84. The housing 74 includes means (not shown) for detachably securing the unit to the panel 86, and a transparent cover 88 secured between an annular spring member 90 and a trim member 92. The portion of the circuitry projecting through aperture 94 is connected to associated circuitry 32, 34 by means of a known connector 96. Suitable representative connectors are described in U.S. Pat. Nos. 3,075,167; 3,107,961; 3,348,191, and 3,665,370.

The connection of the individual indicator units 36 to the associated circuitry 32, 34 can be effected by several means, including the use of a conventional connector 96 discussed above. In the preferred system (see FIG. 9) one or more layers of flat flexible circuitry 98, 100 are laid on the front surface of a panel 102 and held in place by insertion studs 104 through alignment holes 106, 108, and 110. The indicator units 112, 114 differ from the previously described unit 36 only in the means for connection to the associated circuitry. Units 112, 114 are provided with a resilient member 120 secured to housing 74 above aperture 92. The free end of the circuitry 38 extends through the aperture and lies against member 120.

Figure 9:
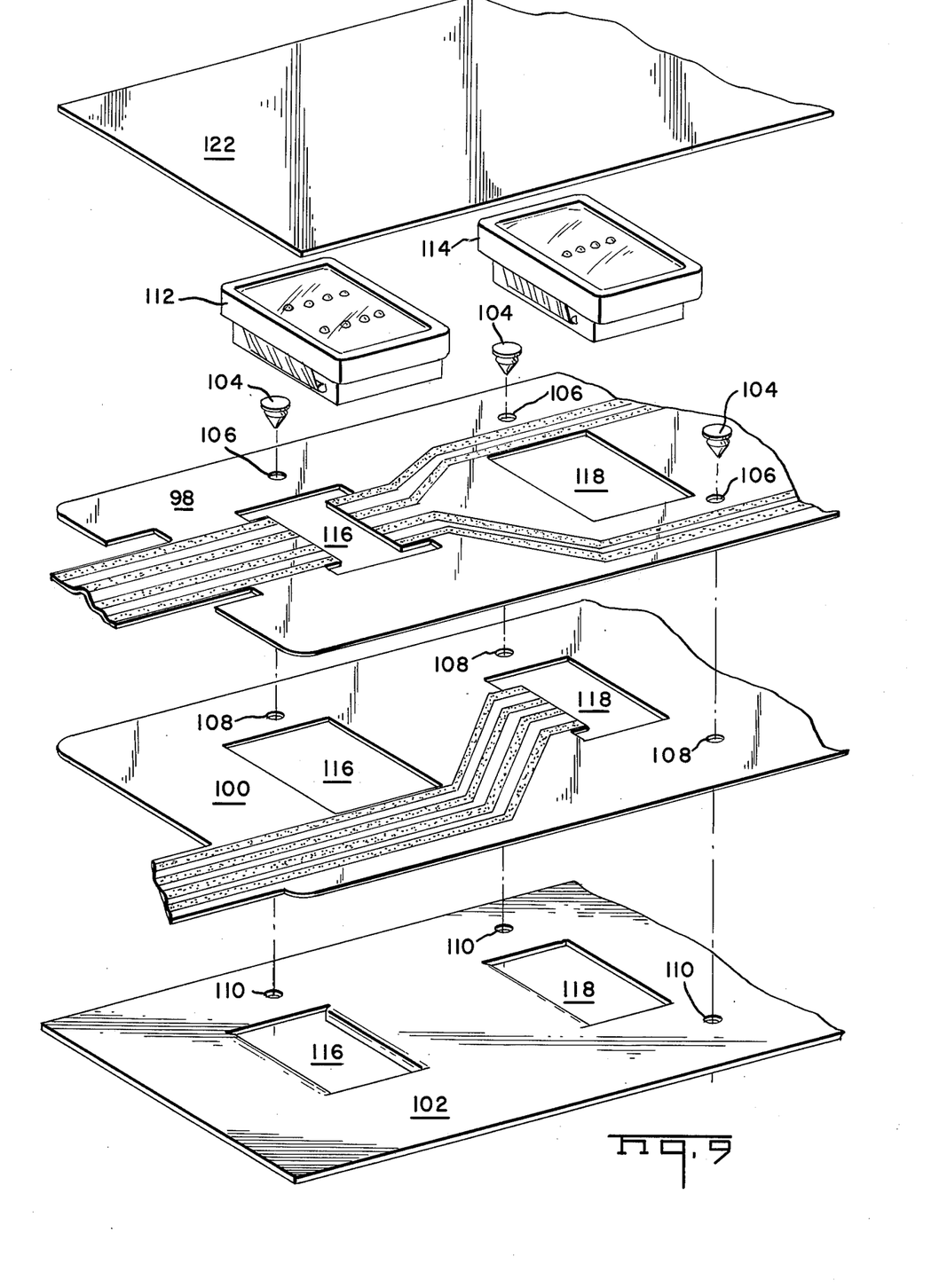
FIG. 9 is an exploded perspective view of one end of an illuminated display panel showing flat flexible circuitry mounted on the front of the panel and the associated indicator units inserted from the front.

The connection of the indicator units 112, 114 to the circuits 98, 100 is made in a fashion similar to the previously described mounting of the light emitting diodes 46 in the indicator circuitry 38. The units 112, 114 are inserted into apertures 116 and 118 in the respective circuits 98, 100 and panel 102 from the front. A predetermined amount of wiping action takes place between the circuitry 38 of the units 112, 114 and the circuitry 98, 100 during this insertion to assure good connection. If desired, either or both mating surfaces of the respective circuitry can have an abrasive included therein, as described in U.S. Pat. No. 3,818,415, to assure a wiping action.

The subject illuminated indicator units could also be connected to flat flexible circuitry, such as 98, 100, by positioning an elastomeric type connector, such as those disclosed in U.S. Pat. Nos. 3,795,884; 3,851,297; and 3,852,878, between the mating surfaces circuitry 98, 100 and the indicator unit. The insertion of the indicator unit into the aperture of the panel causes a compression of the elastomeric connector lying between portions of the unit and the flat flexible circuitry to effect the desired connection.

In the preferred embodiment of the present invention, flat flexible circuitry is simply laid on the face of an apertured panel with any number of layers being added to obtain the desired number of circuits and connections. The individual indicator units are simply inserted into their respective apertures from the front and make contact with the appropriate flat flexible circuitry. The entire dashboard assembly would then preferably be covered by a transparent shield or face plate 122, which would also serve as an anti-theft device.

Figure 10:
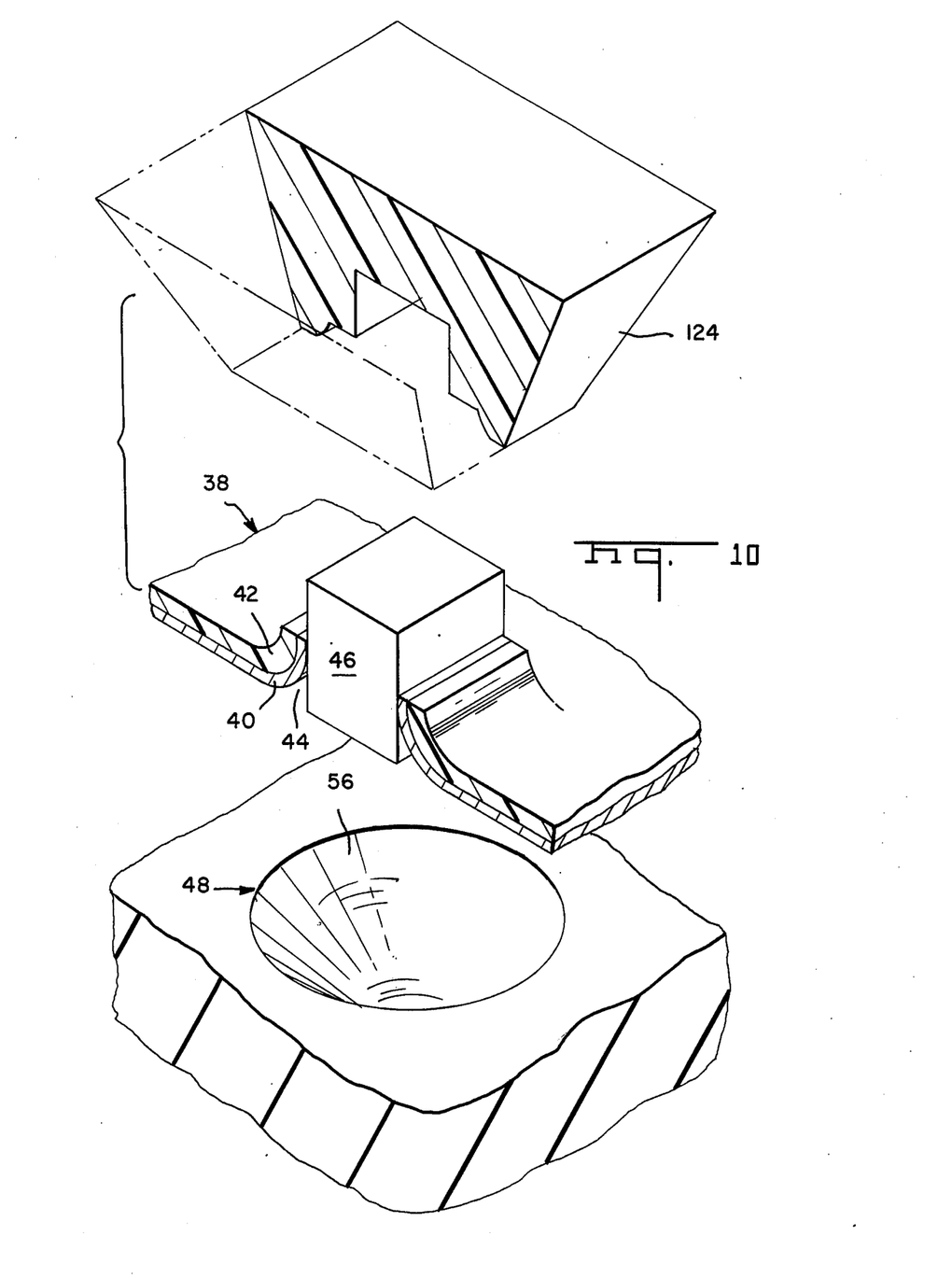
FIG. 10 is an exploded perspective view of an alternate lensing system used with the subject invention.

In some instances it may be desirable to include a broader lensing system 124, such as shown in FIG. 10, which will give an enlarged area of illumination from a single light emitting diode. The lens 124 could be formed by having a plurality of profiled apertures in a plate (not shown). The circuitry would be placed against the plate with the diodes extending into the apertures. A lens forming mixture would then be poured into the aperture to encapsulate the diode in the lens material. As a specific example, a speedometer could be constructed as stated above with a plurality of closely spaced diodes and lenses 124 each representing a 2 or 3 mile per hour range. The associated circuitry would be arranged so that either an individual diode is illuminated for a particular speed or that all diodes from zero to the instant speed would be illuminated, thus giving the driver a more representative indication of his speed.

It should be understood that the flat flexible circuitry can be on the rear of the panel, as shown in FIG. 3, or on the front of the panel, as shown in FIG. 9. This use of flat flexible circuitry allows for a wider range of tolerances which makes the invention more suitable for automated assembly. The entire circuit can be laid on the panel surface and locally positioned within tolerances by staking to the panel with studs 104. Since multiple layers of flat flexible cable are foreseen, clearly it will be possible for a unit to make contact with one or more layers of circuitry according to the requirements of the unit and circuit design.

The preferred light emitting diode used in the subject invention has grid metallization on both major surfaces in order to maximize light output. This also aids in the automated manufacturing process since the diode chip can be poked into a slot in the circuit so as to be suspended or hung in front of a metallic mirror which redirects the diodes light through the optically transparent circuit substrate and thence through an optical protective member, which may be a lens, a diffusing member, or both. The mirror, lens, and circuit are preferably formed with mechanical means for holding themselves together and in registration until the adhesive used is set.

The present invention may be subject to many changes and modifications without departing from the spirit or essential characteristics thereof. Thereof the above-described embodiments are to be considered in all respects as merely illustrative and not restrictive of the scope of the invention.

What is claimed is:

1. A display panel comprising:
    a rigid panel having at least one profiled aperture therein;
    at least one layer of first flat flexible circuitry disposed on a first side of said substrate with portions of said circuitry extending into said at least one aperture; and
    at least one indicating unit inserted in each said aperture to make mechanical and electrical contact with said flexible circuitry, each said unit including a housing, rigid support means, and a second flat flexible circuit comprising a metal conductor adhered to a flexible insulating substrate, at least one slot in said conductor and underlying substrate forming an open in said second circuit, electronic means inserted edgewise into said slot with the resiliency of said conductor and flexible substrate causing the conductor on opposite sides of the slot to make electrical contact with said electronic means which is supported therebetween, said second flat flexible circuit being folded on itself and supported by said rigid support means in said housing with a portion of said second flat flexible circuit extending therefrom to make contact with said first flat flexible circuitry disposed on said panel.

2. A display panel according to claim 1 wherein said first flat flexible circuitry is suitable for transmission of high current and comprises a conductor encased in flexible insulating material, at least a portion of said insulation material being removed from said conductor extending into said apertures to make contact with said indicating units.

3. A display panel according to claim 1 wherein said electronic means is a light emitting diode having a grid metallization on both major surfaces thereof to maximize light output.

4. A display panel according to claim 3 further comprising a reflector adhered to said second flat flexible circuit adjacent one side of said diode and a lens adhered to said second flat flexible circuit on the opposite side of said diode.

5. A display panel according to claim 4 wherein said lens includes light diffusing means.

6. A display panel according to claim 1 further comprising resilient means mounted on said housing serving to bias the second flat flexible circuit into engagement with said first flat flexible circuit on said panel.

7. A display panel according to claim 1 wherein said first flat flexible circuitry lies on the face of said panel and all said indicating units are inserted from the front of said panel.

8. A display panel according to claim 1 wherein said circuitry lies adjacent the rear of said panel.

9. A display panel according to claim 1 further comprising:
an elastomeric connector disposed between said first and said second flat flexible circuits to make electrical connection therebetween, said connector comprising:
a member of resilient material, and
at least one conductor encircling said member so as to make electrical contact with circuits disposed on opposite sides thereof.

10. A display panel according to claim 1 wherein said panel comprises a dashboard of a vehicle, and said indicating units display information regarding the status of the components of the vehicle.

11. An illuminated indicating device comprising:
a first flat flexible circuit including a patterned array of conductors adhered to a flexible insulating substrate, at least one slot formed in said conductor and through said substrate causing an open in said circuit;
at least one light emitting diode inserted into each said slot in an edgewise configuration to make contact with the conductor on both sides thereof and to be supported thereby;
a metallized reflector secured to said first flat flexible circuit adjacent a first side of light emitting diode;
a lens means secured to said flat flexible first circuit on the opposite side of each said light emitting diode from said reflector;
electronic means attached to said first circuit for energizing said diode;
a rigid support member, said flat flexible circuit being positioned on said rigid support member to be supported thereby; and
housing means receiving therein said flat flexible circuit folded about said support member with a portion of said circuit extending beyond said housing to mate with an associated circuit for said device.

12. An illuminated indicating device according to claim 11 wherein said associated circuitry is a second flat flexible circuit supported on a rigid panel having at least one aperture therein, a portion of said second flat flexible circuit projecting over the edge of said aperture, said housing being inserted into said aperture with said first and second flat flexible circuits in wiping engagement.

13. An illuminated indicating device according to claim 11 wherein said associated circuitry is a wiring harness formed of a plurality of discrete wires, said wiring harness including connector means connectng with the first flat flexible circuit.

14. An illuminated indicating device according to claim 11 wherein said associated circuitry is a second flat flexible circuit having a connector fixed to a portion thereof to mate with the first flat flexible circuit.

15. An illuminated indicatng device according to claim 12 wherein said housing has a low profile and can be inserted from a front side of said panel.

16. An illuminated indicating device according to claim 11 wherein said light emitting diode has a metallized grid on each major surface thereof to effect electrical contact with said first flat flexible circuit while allowing maximum light output.

17. An illuminated indicating device according to claim 11 wherein said first flat flexible circuit comprises:
an insulating substrate of light transparent material; and
a metal conductor adhered to said substrate.

18. An illuminated indicating device according to claim 11 further comprising:
an elastomeric connector disposed between said first flat flexible circuit and said associated circuit to effect electrical connection therebetween.

* * * * *